(12) United States Patent
Lee et al.

(10) Patent No.: US 12,532,677 B2
(45) Date of Patent: *Jan. 20, 2026

(54) SUBSTRATE PROCESSING APPARATUS, SUBSTRATE PROCESSING METHOD, AND METHOD OF FABRICATING SEMICONDUCTOR DEVICE

(71) Applicant: SAMSUNG ELECTRONICS CO., LTD., Suwon-si (KR)

(72) Inventors: Woo Rim Lee, Suwon-si (KR); Myoung Jae Seo, Suwon-si (KR); In Hye Jeong, Suwon-si (KR); Sung Gil Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 244 days.

This patent is subject to a terminal disclaimer.

(21) Appl. No.: 18/131,464

(22) Filed: Apr. 6, 2023

(65) Prior Publication Data
US 2024/0105457 A1   Mar. 28, 2024

(30) Foreign Application Priority Data
Sep. 28, 2022   (KR) .................. 10-2022-0123550

(51) Int. Cl.
*H01L 21/3065* (2006.01)
*H01L 21/67* (2006.01)
*H01J 37/32* (2006.01)

(52) U.S. Cl.
CPC .... *H01L 21/3065* (2013.01); *H01L 21/67069* (2013.01); *H01J 37/32522* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 7,309,448 B2 | 12/2007 | Chae et al. | |
| 8,389,416 B2* | 3/2013 | Luong .............. | H01J 37/32082 438/714 |
| 9,236,265 B2 | 1/2016 | Korolik et al. | |
| 9,330,930 B2 | 5/2016 | Kubota et al. | |
| 9,355,922 B2 | 5/2016 | Park et al. | |
| 9,576,809 B2 | 2/2017 | Korolik et al. | |
| 10,395,944 B2 | 8/2019 | Fung et al. | |
| 10,483,127 B2 | 11/2019 | Wang et al. | |
| 2005/0003673 A1 | 1/2005 | Mahdavi | |
| 2015/0126040 A1* | 5/2015 | Korolik ............. | H01J 37/32724 438/718 |
| 2020/0266070 A1* | 8/2020 | Voronin ............ | H01L 21/32136 |
| 2020/0373168 A1* | 11/2020 | Lee .................. | H01J 37/32422 |

FOREIGN PATENT DOCUMENTS

KR   10-2019-0015146 A   2/2019

* cited by examiner

*Primary Examiner* — Shamim Ahmed
(74) *Attorney, Agent, or Firm* — Sughrue Mion, PLLC

(57) ABSTRACT

A substrate processing apparatus, a substrate processing method, and a method of fabricating a semiconductor device are provided. The substrate processing method includes providing a process gas, generating a preliminary etchant, which includes a first etchant and a second etchant, from the process gas through plasma ignition, generating a process etchant by controlling a composition ratio of the preliminary etchant, and performing a selective etching of the substrate with the process etchant.

20 Claims, 20 Drawing Sheets

SUBSTRATE PROCESSING APPARATUS, SUBSTRATE PROCESSING METHOD, AND METHOD OF FABRICATING SEMICONDUCTOR DEVICE

CROSS-REFERENCE TO RELATED APPLICATION

This application claims priority from Korean Patent Application No. 10-2022-0123550 filed on Sep. 28, 2022 in the Korean Intellectual Property Office, the contents of which in its entirety are herein incorporated by reference.

BACKGROUND

1. Technical Field

The present disclosure relates to a substrate processing apparatus, a substrate processing method, and a method of fabricating a semiconductor device, and more particularly, to a substrate processing apparatus using plasma, a substrate processing method using plasma, and a method of fabricating a semiconductor device using plasma.

2. Description of Related Art

A semiconductor device may be formed by various processes for fabricating a semiconductor device such as etching, deposition, ashing, and rinsing. A plasma process capable of accelerating any desired chemical reaction (e.g., deposition or etching) with the use of plasma has been widely used.

As processes for fabricating a semiconductor device have advanced, methods to effectively control etching selectivity and thus to implement desired patterns through etching are being studied. For example, silicon-germanium (SiGe), which is widely used as the material of a sacrificial film in a process for forming a multi-bridge channel, needs to have a higher etching selectivity than silicon (Si). However, a relatively low etching selectivity may be required depending on the purpose of each process, such as controlling etching speed, and process variations from relatively small critical dimensions may require etching selectivity to be controlled in various manners.

SUMMARY

Aspects of the present disclosure provide a method of fabricating a semiconductor device using a substrate processing method capable of dynamically controlling etching selectivity.

Aspects of the present disclosure also provide a substrate processing method capable of dynamically controlling etching selectivity.

Aspects of the present disclosure also provide a substrate processing apparatus capable of dynamically controlling etching selectivity.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of fabricating a semiconductor device, comprising loading a substrate in a substrate processing apparatus, and processing the substrate with the substrate processing apparatus, wherein the processing of the substrate comprises providing a process gas, generating a preliminary etchant, which comprises a first etchant and a second etchant, from the process gas through plasma ignition, generating a process etchant by controlling a composition ratio of the preliminary etchant, and processing the substrate with the process etchant.

According to an aspect of the present disclosure, there is provided a substrate processing method comprising providing a process gas, generating a preliminary etchant, which includes first and second etchants, from the process gas through plasma ignition, generating a process etchant by controlling a composition ratio of the preliminary etchant, and performing a selective etching of the substrate with the process etchant.

According to an aspect of the present disclosure, there is provided a substrate processing method comprising providing a fluorine (F)-contained gas, generating a preliminary etchant, which includes first F radicals, from the F-contained gas through plasma ignition, providing a dummy substrate, which includes a predetermined material, in the processing chamber, providing the preliminary etchant onto the dummy substrate, loading a substrate in the processing chamber, generating a process etchant with a predetermined F radicals-to-$F_2$ ratio by providing second F radicals in the processing chamber, processing the substrate with the process etchant, and unloading the substrate from the processing chamber.

According to an aspect of the present disclosure, there is provided a substrate processing apparatus, comprising a chamber body, a substrate support in the chamber body, a gas supplier supplying a process gas into the chamber body, a plasma generator generating plasma from the process gas, and a shower head supplying first and second etchants, which are generated from the plasma, onto the substrate, wherein a ratio of the first etchant to the second etchant is controlled to a predetermined value to generate a process etchant, and the substrate is processed with the process etchant.

It should be noted that the effects of the present disclosure are not limited to those described above, and other effects of the present disclosure will be apparent from the following description.

BRIEF DESCRIPTION OF DRAWINGS

The above and other aspects and features of the present disclosure will become more apparent by describing in detail exemplary embodiments thereof with reference to the attached drawings, in which.

DETAILED DESCRIPTION

A substrate processing apparatus according to some embodiments of the present disclosure will hereinafter be described with reference to FIG. 1.

Figure 1:
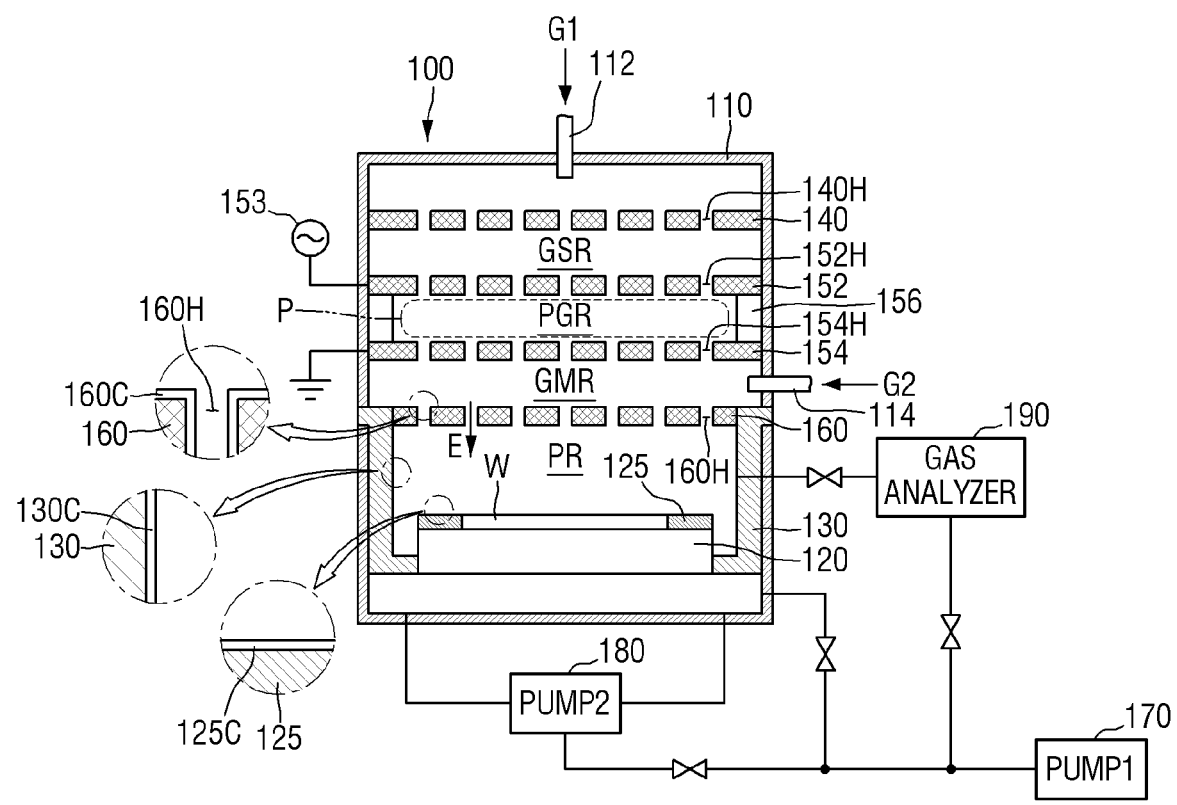
FIG. 1 is a conceptual diagram illustrating a substrate processing apparatus according to some embodiments of the present disclosure.

FIG. 1 is a conceptual diagram illustrating a substrate processing apparatus according to some embodiments of the present disclosure.

Referring to FIG. 1, the substrate processing apparatus may include a processing chamber 100, a first gas supplier 112, a second gas supplier 114, a first pump 170, a second pump 180, and a gas analyzer 190.

The processing chamber 100 may provide space in which to process a substrate W through a plasma process. The substrate W, which is a target subject to processes to be performed in the processing chamber 100, may include a wafer and/or at least one material film on the wafer. The processes that the substrate W is subject to may include a variety of processes such as, for example, etching, deposition, ashing, and rinsing, but the present disclosure is not limited thereto. In some embodiments, etching and rinsing may be performed, for example, in-situ, in the processing chamber 100.

The first gas supplier 112 may provide a first process gas G1 into the processing chamber 100. The first process gas G1 may be a source gas for generating plasma P. In some embodiments, the first process gas G1 may include a fluorine (F)-contained gas. For example, the first process gas G1 may include at least one of $NF_3$, $SiF_6$, $CF_4$, and HF, but the present disclosure is not limited thereto. In some embodiments, the first process gas G1 may further include an inert gas such as helium (He).

The second gas supplier 114 may supply a second process gas G2 into the processing chamber 100. The second process gas G2 may be a source gas to be mixed for forming an etchant E. In some embodiments, the second process gas G2 may include an $F_2$ gas. In some embodiments, the second process gas G2 may include a hydrogen (H)-contained gas. For example, the second process gas G2 may include $NH_3$, but the present disclosure is not limited thereto. In other embodiments, the second gas supplier 114 may not be provided.

The processing chamber 100 may include various regions for processing a plasma process. In some embodiments, the processing chamber 100 may include a gas supply region GSR for uniformly supplying the first process gas G1, a plasma generation region PGR for generating the plasma P from the first process gas G1, a gas mixing region GMR for mixing the plasma P and the second process gas G2, and a processing region PR for arranging and processing the substrate W.

In some embodiments, the processing chamber 100 may include a chamber body 110, a substrate support 120, a focus ring 125, a liner 130, a gas supply plate 140, an upper electrode plate 152, a lower electrode plate 154, and a shower head 160.

The chamber body 110 may provide inner space for processing the substrate W and may separate the inner space of the substrate processing apparatus from the outside. The chamber body 110 may be clean room equipment capable of accurately controlling pressure and temperature. The chamber body 110 may have various shapes such as, for example, a cylindrical shape, an elliptical columnar shape, or a polygonal columnar shape, but the present disclosure is not limited thereto. The chamber body 110 may include, for example, a metal material such as aluminum (Al), but the present disclosure is not limited thereto. The chamber body 110 may be maintained to be grounded to block external noise that may be generated during a plasma process.

The substrate support 120 may be disposed in the chamber body 110. The substrate W may be mounted on the substrate support 120 and may thus be supported by the substrate support 120. The substrate support 120 may include, for example, an electrostatic chuck (ESC), but the present disclosure is not limited thereto.

The focus ring 125 may be disposed on the substrate support 120. The focus ring 125 may be in the form of a ring surrounding the substrate W on the substrate support 120. The focus ring 125 may fix the substrate W on the substrate support 120. Also, the focus ring 125 may improve the efficiency of a plasma process by focusing the etchant E (or the plasma P) onto the surface of the substrate W. The focus ring 125 may include, for example, Si, but the present disclosure is not limited hereto.

The liner 130 may be disposed in the chamber body 110. The liner 130 may define the processing region PR, in which the substrate W is processed. For example, the liner 130 may extend from a lower part of the substrate support 120 and may thus surround the side surfaces of the substrate support 120 and define the bottom surface and the side surfaces of the processing region PR. The liner 130 may protect the chamber body 110 and may prevent metal contamination that may be caused by arcing, by covering metal structures projecting from the chamber body 110. The liner 130 may include a metal material such as Al or ceramic material, but the present disclosure is not limited thereto.

The gas supply plate 140 may be disposed above the upper electrode plate 152. The gas supply plate 140 and the upper electrode plate 152 may define the gas supply region GSR therebetween. The gas supply plate 140 may provide the first process gas G1, which is provided by the first gas supplier 112, to the gas supply region GSR. For example, the gas supply plate 140 may include a plurality of first holes 140H. The first process gas G1 may be provided to the gas supply region GSR through the first holes 140H.

The upper electrode plate 152 may be disposed above the lower electrode plate 154. The upper electrode plate 152 and the lower electrode plate 154 may define the plasma generation region PGR therebetween. The upper electrode plate 152 may provide the first process gas G1, which is provided from the gas supply region GSR, to the plasma generation region PGR. For example, the upper electrode plate 152 may include a plurality of second holes 152H. The first process gas G1 may be provided to the plasma generation region PGR through the second holes 152H.

In order to generate the plasma P in the plasma generation region PGR, a plasma generator may be provided. In some embodiments, the upper electrode plate 152 may be provided as an upper electrode of the plasma generator, and the lower electrode plate 154 may be provided as a lower electrode of the plasma generator. For example, a power supply unit 153 may be connected to the upper electrode plate 152 so that radio frequency (RF) power may be applied to the upper electrode plate 152, and the lower electrode plate 154 may be grounded. An insulating ring 156 may be interposed between the upper electrode plate 152 and the lower electrode plate 154 and may electrically isolate the upper electrode plate 152 and the lower electrode plate 154. When the first process gas G1 is supplied to the plasma generation region PGR, RF power may be applied to the upper electrode plate 152 so that the plasma P may be generated in the plasma generation region PGR.

In some embodiments, the plasma P, which is generated from the first process gas G1, may include radicals. For example, in a case where the first process gas G1 includes an F-contained gas, the plasma P may include F radicals.

In some embodiments, the plasma P, which is generated from the first process gas G1, may also include components such as ions, electrons, or ultraviolet light. At least one of these components may be used in an etching process, a deposition process, and/or a rinsing process. Particularly, radicals are electrically neutral and may thus be used in a rinsing process or an isotropic etching process. Alternatively, radicals may be used to interfere with or suppress the deposition of particular ingredients during a deposition process. Ions are electrically polar and may thus be used in an anisotropic etching process.

FIG. 1 illustrates that the plasma P is generated by a capacitively-coupled plasma (CCP) method, but the present disclosure is not limited thereto. Alternatively, in some embodiments, the plasma P may be generated by an inductively-coupled plasma (ICP) method or by the combination of the CCP method and the ICP method.

The lower electrode plate 154 may be disposed above the shower head 160. The lower electrode plate 154 and the shower head 160 may define the gas mixing region GMR therebetween. The lower electrode plate 154 may provide the plasma P, which is generated in the plasm generation region PGR, to the gas mixing region GMR. For example, the lower electrode plate 154 may include a plurality of third holes 154H. The plasma P, which is generated by the plasma generation region PGR, may be provided to the gas mixing region GMR through the third holes 154H. In some embodiments, the plasma P provided to the gas mixing region GMR may generate the etchant E, which is for processing the substrate W.

In some embodiments, the plasma P, which is generated by the plasma generation region PGR, may be used in a radical-based plasma process. For example, the lower electrode plate 154 may selectively pass radicals from the plasma P therethrough. In this manner, the radicals generated from the first process gas G1 may be provided to the gas mixing region GMR and may generate an etchant E including radicals. Other components of the plasma P such as ions, electrons, or UV light may not pass through, but may be blocked by, the lower electrode plate 154.

The second gas supplier 114 may provide the second process gas G2 to the gas mixing region GMR. In some embodiments, the second process gas G2 may be mixed with radicals in the gas mixing region GRM and may thus form the etchant E.

The shower head 160 may be disposed above the substrate support 120. The shower head 160 may define the processing region PR together with the liner 130. For example, the liner 130 may define the bottom surface and the side surfaces of the processing region PR, and the shower head 160 may define the top surface of the processing region PR. The shower head 160 may provide the etchant E (or the plasma P) from the gas mixing region GMR to the processing region PR. For example, the shower head 160 may include a plurality of fourth holes 160H. The etchant E (or the plasma P) may be provided to the processing region PR through the fourth holes 160H.

The gas supply plate 140, the upper electrode plate 152, the lower electrode plate 154, and the shower head 160 may have various shapes such as a circular plate shape, an elliptical plate shape, or a polygonal plate shape, but the present disclosure is not limited thereto. The gas supply plate 140, the upper electrode plate 152, the lower electrode plate 154, and the shower head 160 may include a material resistant to plasma, such as, for example, a metal material or a ceramic material, but the present disclosure is not limited thereto.

In some embodiments, at least parts of the surfaces of the processing chamber 100 may be coated with a material film resistant to plasma. For example, the surfaces of the focus ring 125 may be coated with a first coating film 125C, the surfaces of the liner 130 may be coated with a second coating film 130C, and the surfaces of the shower head 160 may be coated with a third coating film 160C. The first, second, and third coating films 125C, 130C, and 160C may include at least one of $Y_2O_3$, YOF, $YF_3$, Ni, $Al_2O_3$, AlOF, AlN, Al, quartz ($SiO_2$), $ZrO_2$, and ceramic, but the present disclosure is not limited thereto. The first, second, and third coating films 125C, 130C, and 160C may include the same material or different materials.

The first and second pumps 170 and 180 may be connected to the chamber body 110. The first and second pumps 170 and 180 may be controlled by valves connected thereto and may thus control the pressure inside the processing chamber 100.

In some embodiments, the first pump 170 may include a dry pump. The dry pump, unlike an oil diffusion pump, may not contain oil for sealing and lubrication to maintain a vacuum inside the processing chamber 100. The dry pump may provide a vacuum pressure of about $10^{-2}$ mbar and has the advantage of high vacuum cleanliness. The dry pump may be one of, for example, a claw pump, a multi-stage roots pump, a roots-claw combination pump, a scroll pump, a screw pump, a diaphragm pump, and a molecular drag pump, but the present disclosure is not limited thereto.

In some embodiments, the second pump 180 may include a turbo molecular pump (TMP). The TMP, which is a type of vacuum pump similar to a turbo pump, may secure and maintain a vacuum. The TMP may include, for example, a fan rotor rotating fast. The TMP may provide a high vacuum pressure by controlling the magnitude and the direction of the momentum of gas molecules with the fan rotor. In some embodiments, the second pump 180 may be provided between the processing chamber 100 and the first pump 170.

The gas analyzer 190 may be connected to the chamber body 110. The gas analyzer 190 may analyze any gas in the chamber body 110. For example, the gas analyzer 190 may be connected to the processing region PR to measure and analyze any gas generated in the processing region PR. For example, the gas analyzer 190 may measure the ratio of a first etchant to a second etchant.

In some embodiments, the gas analyzer 190 may include a residual gas analyzer (RGA). The RGA may be equipment for measuring any residual gas in a vacuum system, based on mass spectrometry, and may monitor the amount of gas or any chemical reaction in the vacuum system in real-time. In some embodiments, the gas analyzer 190 may be provided between the processing chamber 100 and the first pump 170. In this case, the flow of gas through the gas analyzer 190 can be improved.

A substrate processing method according to some embodiments of the present disclosure will hereinafter be described with reference to FIGS. 1 through 11. FIGS. 3 through 11 illustrate a plasma process using an F radical-based etchant, but one of ordinary skill in the art to which the present disclosure pertains will understand that the technical concept of the present disclosure is also applicable to plasma processes using other etchants.

Figure 2:
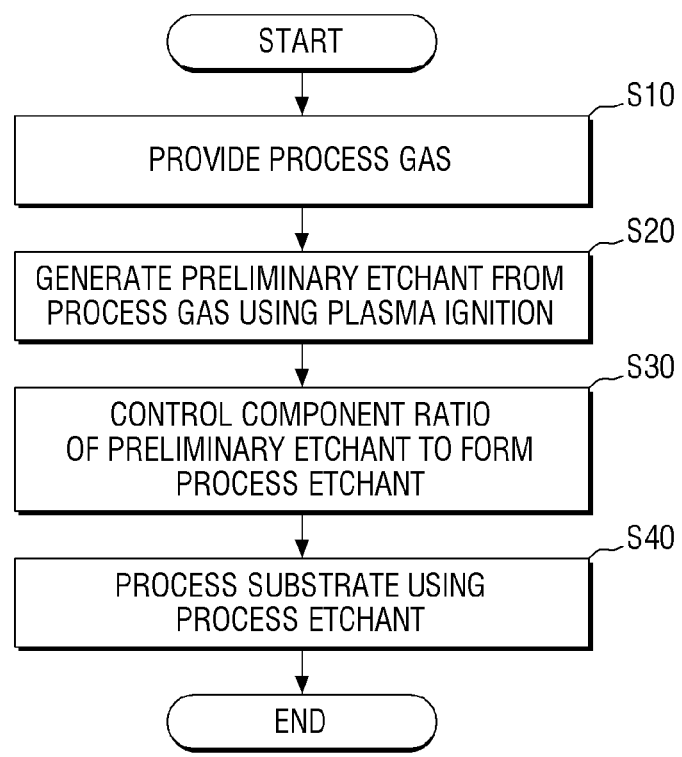
FIG. 2 is a flowchart of a substrate processing method according to some embodiments of the present disclosure.

FIG. 2 is a flowchart of a substrate processing method according to some embodiments of the present disclosure.

Referring to FIGS. 1 and 2, a process gas is provided (S10).

For example, a first process gas G1 may be provided into the processing chamber 100 by the gas supplier 112. In some embodiments, the process gas may include an F-contained gas. For example, the process gas may include at least one of $NF_3$, $SiF_6$, $CF_4$, and HF, but the present disclosure is not limited thereto. In some embodiments, the process gas may further include an inert gas such as He.

Thereafter, a preliminary etchant is generated from the process gas through plasma ignition (S20).

For example, when the first process gas G1 is provided to the plasma generation region PGR, RF power may be applied to the upper electrode plate 152 so that the plasma P may be generated. The plasma P may be provided to the gas mixing region GMR and may thus generate the preliminary etchant. In some embodiments, the preliminary etchant may include radicals. For example, in a case where the process gas includes an F-contained gas, the preliminary etchant may include F radicals.

The preliminary etchant may include different types of etchants. For example, the preliminary etchant may include first and second etchants having different etching selectivities with respect to an etching target (e.g., the substrate W). For example, in a case where the process gas includes an F-contained gas, the first etchant may include F radicals ("F*"), and the second etchant may include $F_2$. The $F_2$ of the second etchant may be an $F_2$ gas or $F_2$ radicals ("$F_2$*"). The $F_2$ of the second etchant may be formed by combining, for example, F radicals, or may be provided by the second gas supplier 114 as the second process gas G2.

Thereafter, a process etchant is generated by controlling the composition ratio of the preliminary etchant (S30).

For example, the ratio of the first etchant to the second etchant may be controlled to a predetermined value to generate the process etchant. As the first and second etchants have different selectivities with respect to the target of etching, the process etchant may have an etching selectivity controlled in accordance with the ratio of the first etchant to the second etchant. It will be described later how to control the ratio of the first etchant to the second etchant with reference to FIGS. 3 through 9.

Thereafter, the substrate W is processed with the process etchant (S40).

For example, the substrate W may be etched with the process etchant in the processing region PR. As the process etchant has an etching selectivity controlled in accordance with the ratio of the first etchant to the second etchant, a selective etching process can be performed for various film types.

Figure 3:
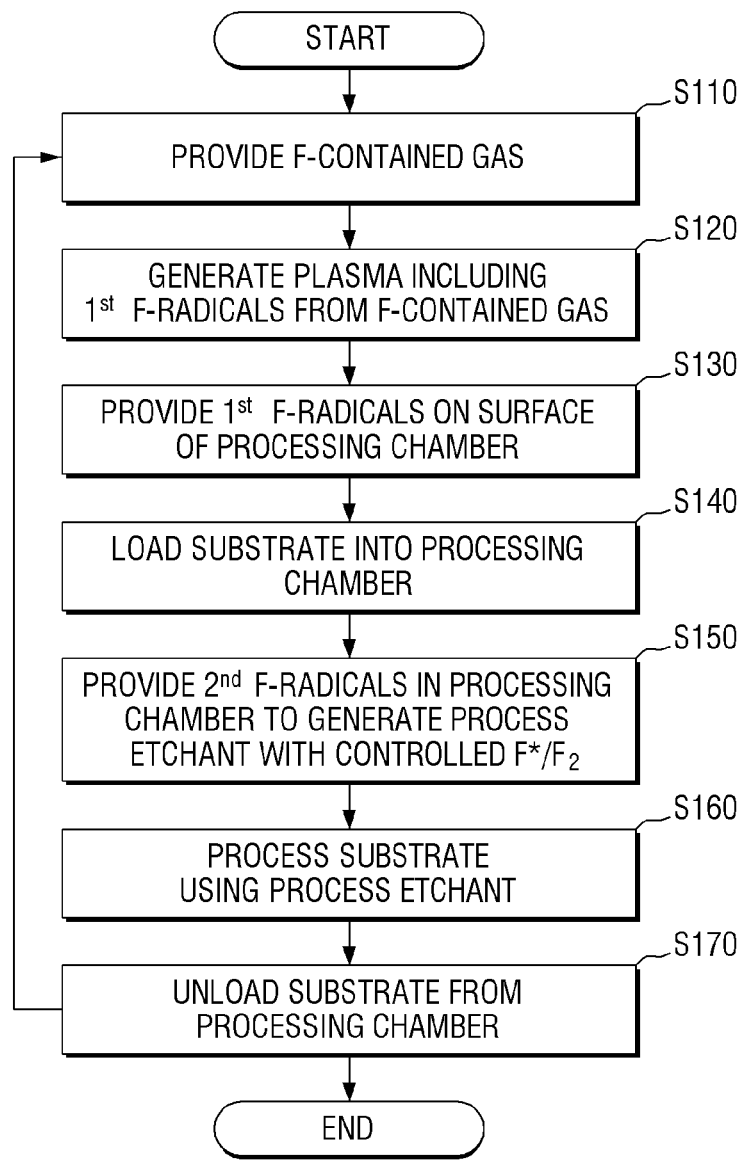
FIG. 3 is a flowchart illustrating a substrate processing method according to some embodiments of the present disclosure.
Figure 4:
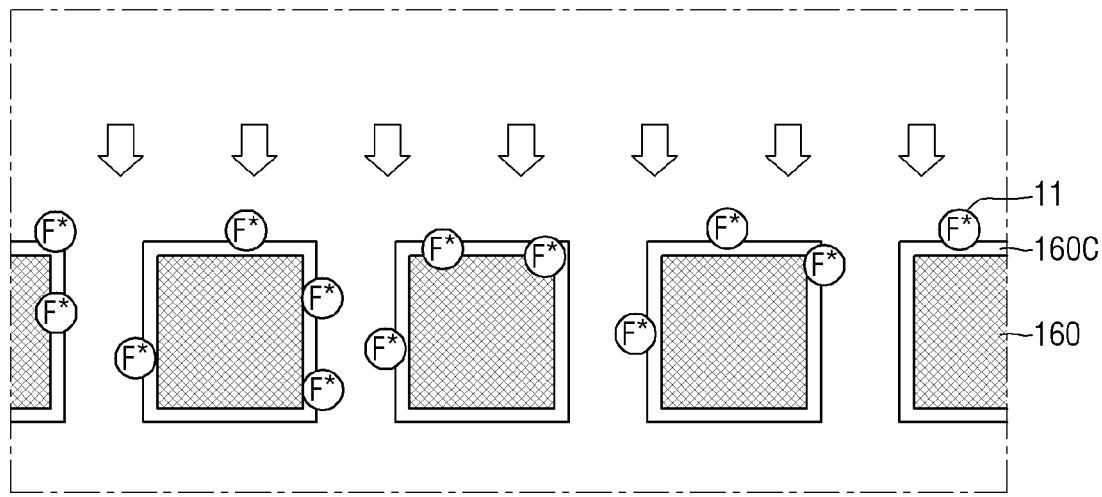
FIGS. 4 and 5 illustrate intermediate steps of the substrate processing method of FIG. 3.
Figure 5:
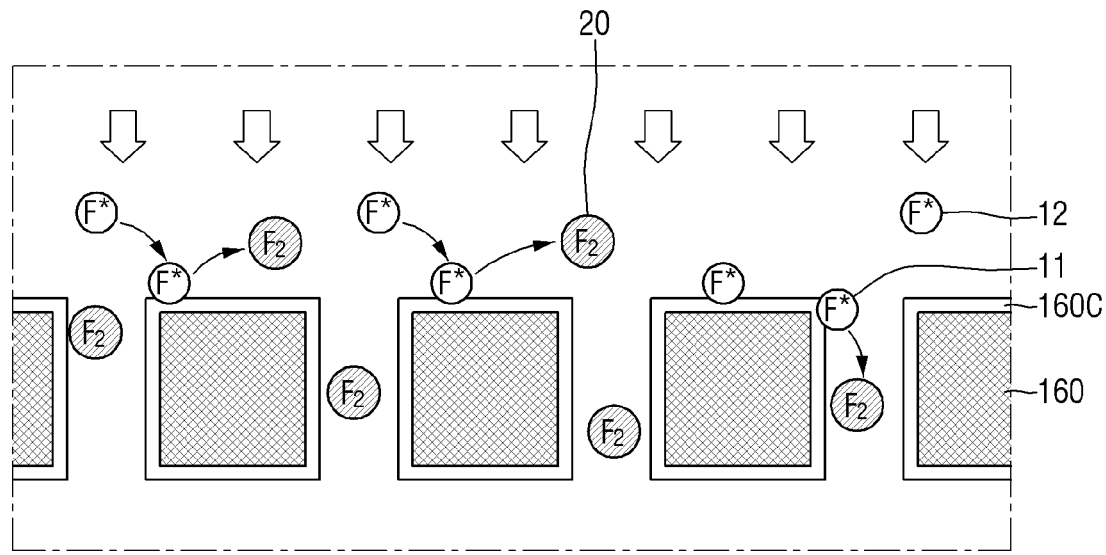
Figure 6:
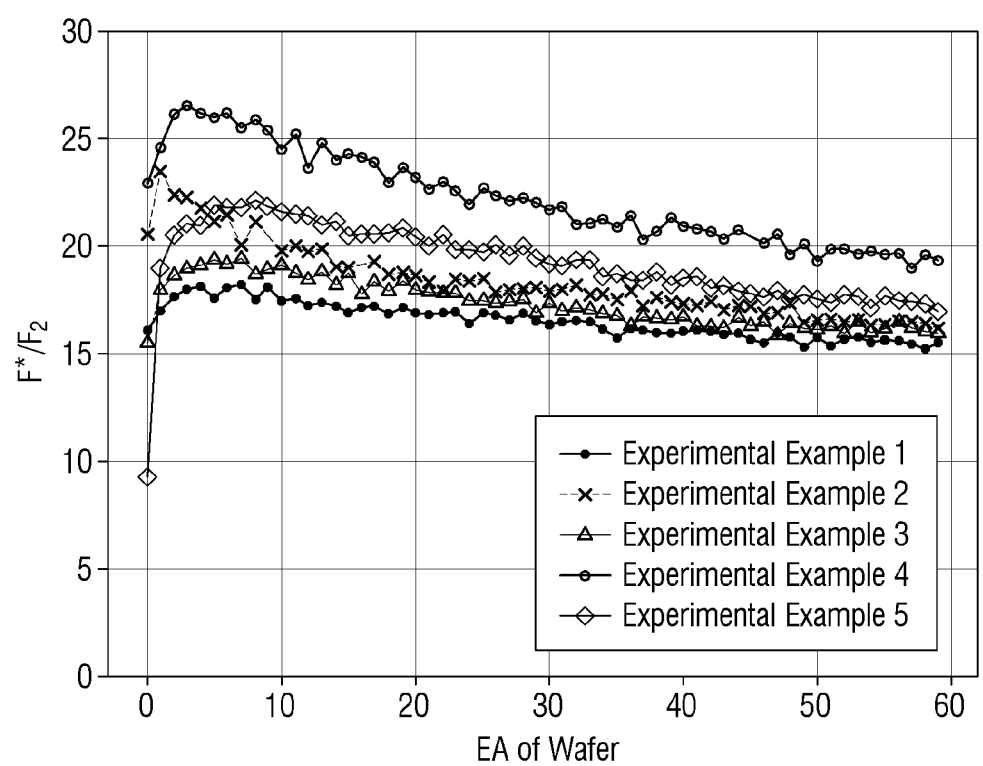
FIG. 6 is a graph showing the change of $F^*/F_2$ with the surface conditions of the processing chamber 100.

FIG. 3 is a flowchart illustrating a substrate processing method according to some embodiments of the present disclosure. FIGS. 4 and 5 illustrate intermediate steps of the substrate processing method of FIG. 3. FIG. 6 is a graph showing the change of $F^*/F_2$ with the surface conditions of the processing chamber 100.

Referring to FIGS. 1 through 6, S30 includes using the surface conditions of the processing chamber 100.

Specifically, an F-contained gas is provided (S110).

For example, an F-contained gas may be provided to the processing chamber 100 as a first process gas G1 by the first gas supplier 112. The F-contained gas may include, for example, at least one of $NF_3$, $SiF_6$, $CF_4$, and HF. In some embodiments, the F-contained gas may further include an inert gas such as He.

Thereafter, plasma P including first F radicals is generated from the F-contained gas (S120).

For example, when the F-contained gas is provided to the plasma generation region PGR, RF power may be applied to the upper electrode plate 152, and as a result, the plasma P including the first F radicals may be generated.

Thereafter, the first F radicals are provided onto the surfaces of the processing chamber 100 (S130).

For example, the plasma P including the first F radicals may be provided to the gas mixing region GMR and/or the processing region PR. As a result, a preliminary etchant including F radicals ("F*") as a first etchant and $F_2$ as a second etchant may be generated. The $F_2$ of the second etchant may be generated by, for example, the combination of the F radicals or may be provided as a second process gas G2 by the second gas supplier 114.

Some of the first F radicals may be adsorbed onto the surfaces of the processing chamber 100 (e.g., on the surfaces of the focus ring 125, the surfaces of the liner 130, and/or the surfaces of the shower head 160). For example, referring to FIG. 4, at least some of the first F radicals ("11") may be adsorbed onto the surfaces of the shower head 160 (and/or the surface of the third coating film 160C).

In some embodiments, after the provision of the first F radicals onto the surfaces of the processing chamber 100, pumping may be performed using the first pump 170 and/or the second pump 180. As a result of pumping, the pressure inside the processing chamber 100 may be controlled, and ingredients (e.g., F* and/or $F_2$) not adsorbed on the surfaces of the processing chamber 100 may be released.

In some embodiments, S110, S120, and S130 may be incorporated into, and performed as, an in-situ rinsing process, which is performed before an etching process for the substrate W.

Thereafter, the substrate W is loaded in the processing chamber 100 (S140).

The substrate W may be mounted on the substrate support 100 and may be provided in the processing region PR. In some embodiments, the substrate W may include different material films. For example, the substrate W may include one or more first material films, which include Si, and/or one or more second material films, which include SiGe.

Thereafter, a process etchant with its first etchant-to-second etchant ratio (i.e., $F^*/F_2$) controlled is generated by providing second F radicals in the processing chamber 100 (S150).

The second F radicals may be generated in a similar manner to the first F radicals. For example, after the loading of the substrate W in the processing chamber 100, an F-contained gas may be provided in the processing chamber 100 as a first process gas G1 by the first gas supplier 112. When the F-contained gas is provided to the plasma generation region PGR, RF power may be provided to the upper electrode plate 152, and as a result, plasma P including the second F radicals may be generated.

Referring to FIG. 5, when the second F radicals are provided in the processing chamber 100, at least some of the second F radicals 12 ("F*") may recombine with the first F radicals 11 ("F*") adsorbed on the surfaces of the processing chamber 100, thereby generating $F_2$ 20 ("$F_2$"). Here, the $F_2$ 20 may be an $F_2$ gas ("$F_2(g)$") or $F_2$ radicals ("$F_2$*").

The generation rate of $F_2$ (or the combination rate of F radicals ("F*") may be controlled in accordance with the surface conditions of the processing chamber 100. Here, the surface conditions of the processing chamber 100 may refer to the surface material of the processing chamber 100, and the presence and the type of coating films on the surfaces of the processing chamber 100 (e.g., the first, second, and third coating films 125C, 130C, and 160C). In this manner, the process etchant with its first etchant-to-second etchant ratio (i.e., $F^*/F_2$) controlled may be generated.

FIG. 6 shows the change of the first etchant-to-second etchant ratios (i.e., $F^*/F_2$) of Experimental Examples 1 through 5.

TABLE 1

|  | First Coating Film | Second Coating Film |
| --- | --- | --- |
| Experimental Example 1 | — | — |
| Experimental Example 2 | Ni | — |
| Experimental Example 3 | $Y_2O_3$ | — |
| Experimental Example 4 | Ni | Ni |
| Experimental Example 5 | $Y_2O_3$ | $Y_2O_3$ |

Referring to Table 1 and FIG. 6, compared to the case of not using the coating film (i.e., Experimental Example 1), the case of using the coating film (i.e., Experimental Examples 2 through 5) has greater first etchant-to-second etchant ratios. In addition, compared to the case of using $Y_2O_3$ as the coating film (i.e., Experimental Examples 3 and 5), the case of using Ni as the coating film (i.e., Experimental Examples 2 and 4) has greater first etchant-to-second etchant ratios.

Thereafter, referring again to FIG. 3, the substrate W is processed with the process etchant (S160).

For example, the substrate W may be etched with the process etchant in the processing region PR. As already mentioned above, as the process etchant has an etching selectivity controlled in accordance with $F^*/F_2$, a selective etching process can be performed for various film types.

Thereafter, the substrate W is unloaded from the processing chamber 100 (S170). Thereafter, S110, S120, S130, S140, S150, S160, and S170 may be repeatedly performed to perform a plasma process on another substrate W. In this manner, a substrate processing method capable of dynamically controlling etching selectivity can be provided.

Figure 7:
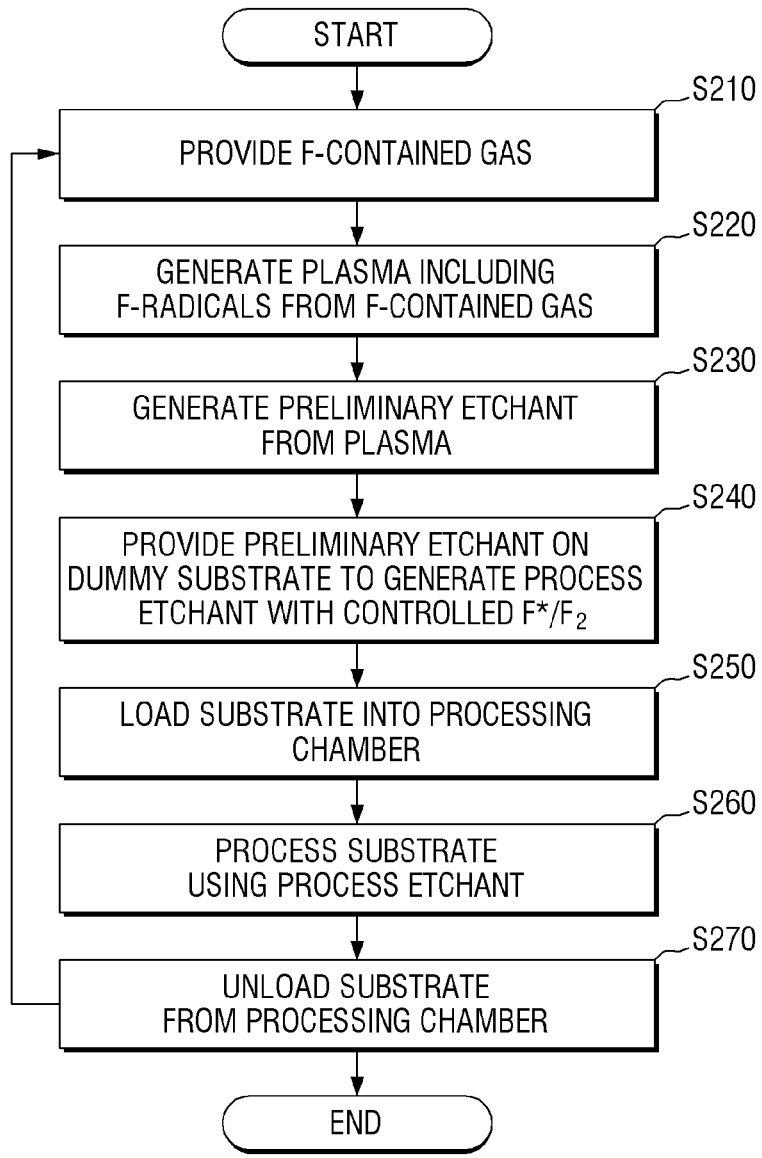
FIG. 7 is a flowchart illustrating a substrate processing method according to some embodiments of the present disclosure.
Figure 8:
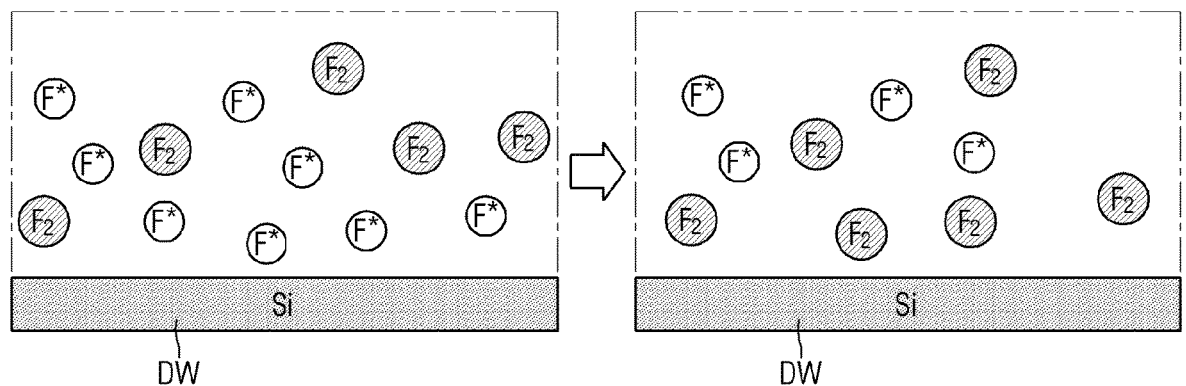
FIGS. 8 and 9 illustrate intermediate steps of the substrate processing method.
Figure 9:
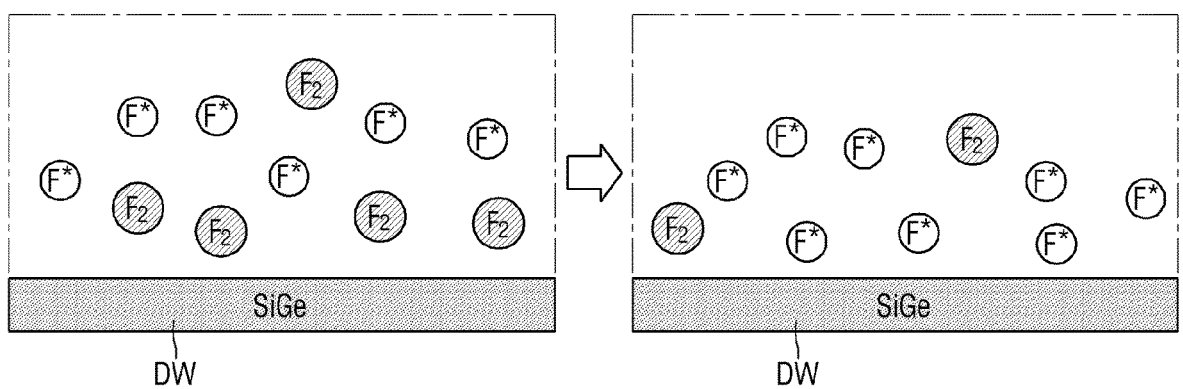
Figure 10:
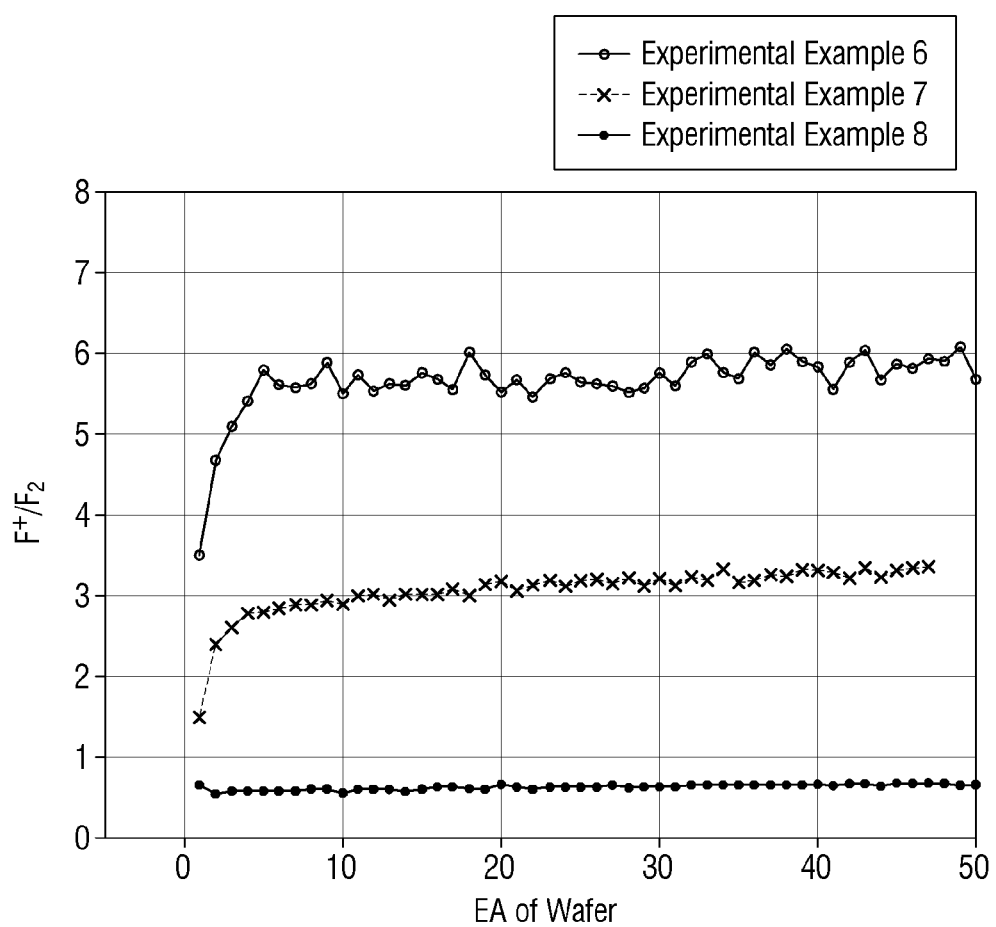
FIG. 10 is a graph showing the change of $F^*/F_2$ with the type of a dummy substrate.

FIG. 7 is a flowchart illustrating a substrate processing method according to some embodiments of the present disclosure. FIGS. 8 and 9 illustrate intermediate steps of the substrate processing method. FIG. 10 is a graph showing the change of $F^*/F_2$ with the type of a dummy substrate.

Referring to FIGS. 1, 2, and 7 through 10, S30 includes using a dummy substrate.

Specifically, an F-contained gas is provided (S210).

For example, an F-contained gas may be provided in the processing chamber 100 as a first process gas G1 by the first gas supplier 112. The F-contained gas may include at least one of $NF_3$, $SiF_6$, $CF_4$, and HF. In some embodiments, the F-contained gas may further include an inert gas such as He.

Thereafter, plasma P including F radicals (F*) is generated from the F-contained gas (S220).

For example, when the F-contained gas is provided to the plasma generation region PGR, RF power may be applied to the upper electrode plate 152, and as a result, the plasma P including the F radicals may be generated.

Thereafter, a preliminary etchant is generated from the plasma P (S230).

For example, the plasma P including the F radicals may be provided to the gas mixing region GMR and/or the processing region PR. As a result, a preliminary etchant including the F radicals as a first etchant and $F_2$ as a second etchant may be generated. The $F_2$ of the second etchant may be generated by, for example, the combination of the F radicals, or may be provided as a second process gas G2 by the second gas supplier 114.

Thereafter, a process etchant is generated with its first etchant-to-second etchant ratio (i.e., $F^*/F_2$) controlled (S240).

For example, a dummy substrate may be loaded in the processing chamber 100 as the substrate W. The dummy substrate may include a predetermined material. The dummy substrate may include a wafer and/or at least one material film on the wafer. For example, the dummy substrate may be a Si substrate or a SiGe substrate, but the present disclosure is not limited thereto.

When the preliminary etchant is provided onto the dummy substrate, the composition ratio of the preliminary etchant may be controlled in accordance with the material of the dummy substrate, which is exposed to the preliminary etchant.

For example, referring to FIG. 8, a preliminary etchant including F radicals ("F*") and $F_2$ may be provided onto a dummy substrate DW including Si. As F radicals are more reactive than $F_2$ with respect to Si, the F radicals of the preliminary etchant may be selectively consumed by the dummy substrate DW. As a result, a process etchant with a reduced first etchant-to-second etchant ratio (i.e., $F^*/F_2$) may be generated.

In another example, referring to FIG. 9, a preliminary etchant including F radicals ("F*") and $F_2$ may be provided onto a dummy substrate DW including SiGe. As $F_2$ is more reactive than F radicals with respect to SiGe, the $F_2$ of the preliminary etchant may be selectively consumed by the dummy substrate DW. As a result, a process etchant with an increased first etchant-to-second etchant ratio (i.e., $F^*/F_2$) may be generated.

FIG. 10 shows the change of the first etchant-to-second etchant ratios (i.e., $F^*/F_2$) of Experimental Examples 6 through 8.

TABLE 2

|  | Dummy Substrates |
| --- | --- |
| Experimental Example 6 | SiGe Wafers |
| Experimental Example 7 | $SiO_2$ Wafers |
| Experimental Example 8 | Si Wafers |

Referring to Table 2 and FIG. 10, Experimental Example 7, which uses $SiO_2$ wafers, has lower first etchant-to second etchant ratios than Experimental Example 6, which uses SiGe wafers, and Experimental Example 8, which uses Si wafers, has lower first etchant-to second etchant ratios than Experimental Example 7, which uses $SiO_2$ wafers.

In some embodiments, S210, S220, S230, and S240 may be incorporated into, and performed as, a dummy process, which is performed for process stability before the loading of the substrate W.

Thereafter, the substrate W is loaded in the processing chamber 100 (S250).

The substrate W, which is a target subject to processes to be performed in the processing chamber 100, may include a wafer and/or at least one material film on the wafer. The substrate W may be mounted on the substrate support 120 and may be provided in the processing region PR. In some embodiments, the substrate W may include different material films. For example, the substrate W may include one or more first material films, which include Si, and/or one or more second material films, which include SiGe.

In some embodiments, the dummy substrate may be unloaded from the processing chamber 100 before the loading of the substrate W.

Thereafter, the substrate W is processed with the process etchant (S260).

For example, the substrate W may be etched with the process etchant in the processing region PR. As already mentioned above, as the process etchant has an etching selectivity controlled in accordance with the ratio of the first etchant to the second etchant, i.e., $F^*/F_2$, a selective etching process can be performed for various film types.

Thereafter, the substrate W is unloaded from the processing chamber 100 (S270). Thereafter, S210, S220, S230, S240, S250, S260, and S270 may be repeatedly performed to perform a plasma process on another substrate W. In this manner, a substrate processing method capable of dynamically controlling etching selectivity can be provided.

Figure 11:
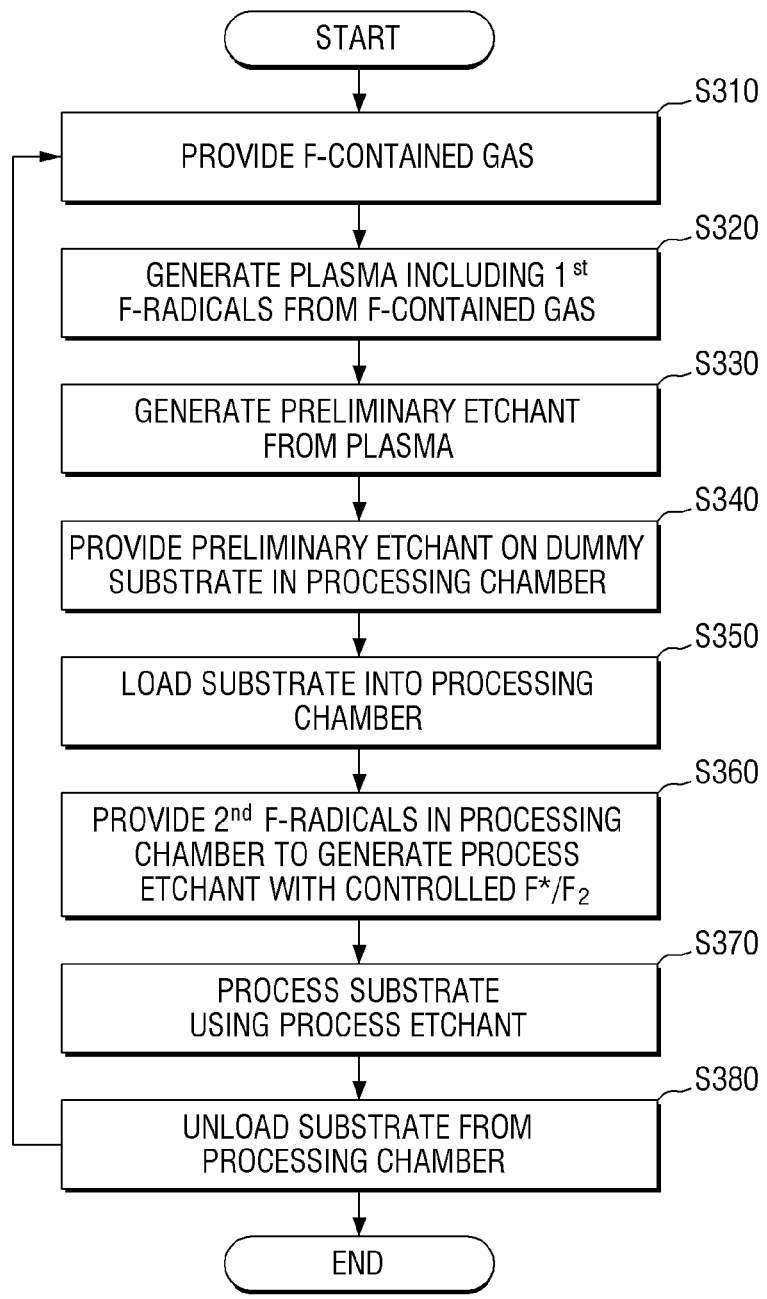
FIG. 11 is a flowchart illustrating a substrate processing method according to some embodiments of the present disclosure.

FIG. 11 is a flowchart illustrating a substrate processing method according to some embodiments of the present disclosure. For convenience, the embodiment of FIG. 11 will hereinafter be described, focusing mainly on the differences with the embodiments of FIGS. 1 through 10.

Referring to FIG. 11, the substrate processing method includes: providing an F-contained gas (310); generating plasma P including first F radicals from the F-contained gas (320); generating a preliminary etchant from the plasma P (S330); providing the preliminary etchant onto a dummy substrate in the processing chamber 100 (S340); loading a substrate W in the processing chamber 100 (S350); generating a process etchant with its first etchant-to-second etchant ratio (i.e., $F^*/F_2$) controlled, by providing second F radicals in the processing chamber 100 (S360); processing the substrate W with the process etchant (S370); and unloading the substrate W from the processing chamber 100 (S380).

As already mentioned above with reference to FIGS. 3 through 6, as the preliminary etchant is provided onto the dummy substrate in the processing chamber 100 (S340), at least some of the first F radicals may be adsorbed onto the surfaces of the processing chamber 100 (e.g., the surfaces of focus ring 125, the surfaces of the liner 130, and/or the surfaces of the shower head 160). Also, as already mentioned above with reference to FIGS. 7 through 10, the composition ratio of the preliminary etchant may be controlled in accordance with the type of the dummy substrate, which is exposed to the preliminary etchant.

Thereafter, as already mentioned above with reference to FIGS. 3 through 6, when the second F radicals are provided in the processing chamber 100 (S360), at least some of the second F radicals may recombine with the first F radicals adsorbed on the surfaces of the processing chamber 100, thereby generating $F_2$ ("20" of FIG. 5). In this manner, the process etchant with its first etchant-to-second etchant ratio (i.e., $F^*/F_2$) controlled may be generated.

When the substrate W is unloaded from the processing chamber 100 (S370), S310, S320, S330, S340, S350, S360, and S370 may be repeatedly performed to perform a plasma process on another substrate W. In this manner, a substrate processing method capable of dynamically controlling etching selectivity can be provided.

Figure 12:
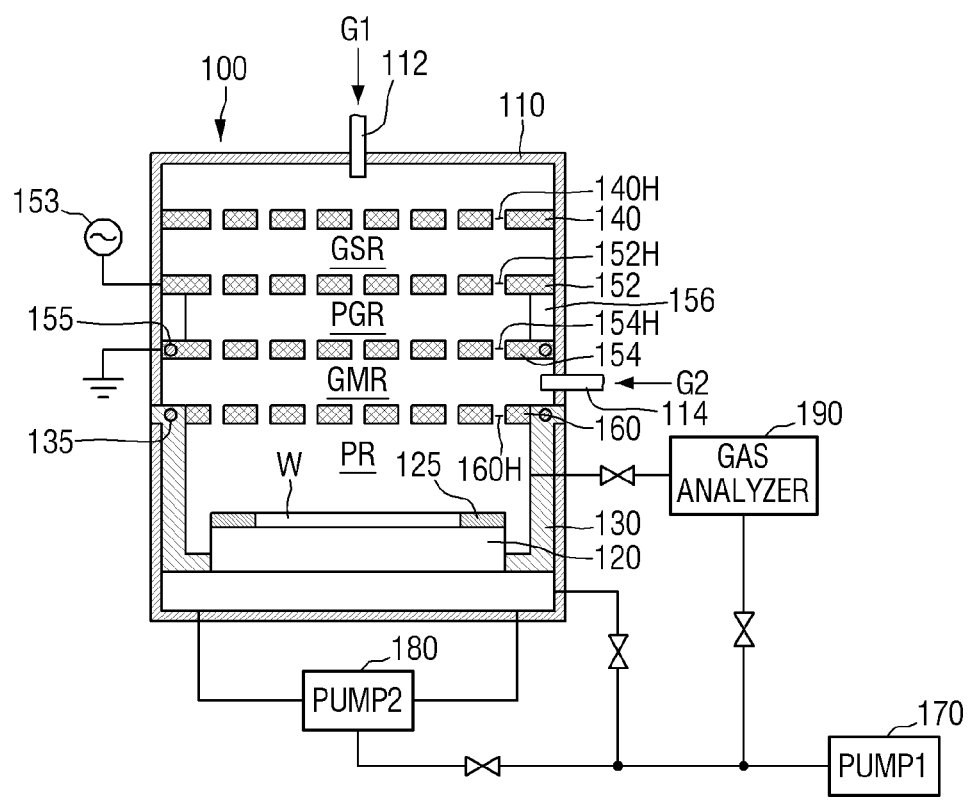
FIGS. 12 and 13 illustrate substrate processing apparatuses according to some embodiments of the present disclosure.
Figure 13:
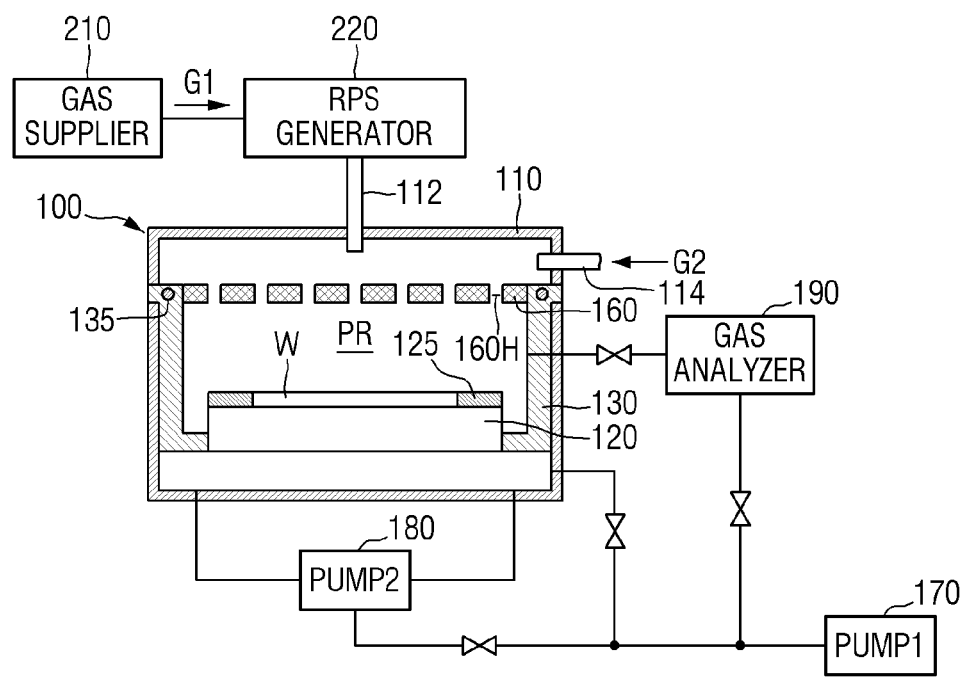

FIGS. 12 and 13 illustrate substrate processing apparatuses according to some embodiments of the present disclosure. For convenience, the embodiments of FIGS. 12 and 13 will hereinafter be described, focusing mainly on the differences with the embodiments of FIGS. 1 through 11.

Referring to FIG. 12, the substrate processing apparatus further includes first temperature controllers 135 and 155.

For example, the first temperature controller 135 may be disposed in a liner 130. The first temperature controller 135 may be in the form of a ring extending along the top of the liner 130, but the present disclosure is not limited thereto. The first temperature controller 135 may be disposed adjacent to a shower head 160. For example, the first temperature controller 135 may be on a sidewall of the shower head 160. Accordingly, the first temperature controller 135 may control the temperature of the shower head 160. In some embodiments, the first temperature controller 135 may uniformly maintain the shower head 160 at a predetermined temperature. For example, the first temperature controller 135 may control the temperature of the shower head 160 in the range of about 50° C. to about 200° C.

For example, the second temperature controller 155 may be disposed in a lower electrode plate 154. The second temperature controller 155 may be in the form of a ring extending along the outer circumferential surface of the lower electrode plate 154, but the present disclosure is not limited thereto. In some embodiments, the second temperature controller 155 may control the temperature of the lower electrode plate 154. In some embodiments, the second temperature controller 155 may uniformly maintain the lower electrode plate 154 at a predetermined temperature. For example, the second temperature controller 155 may control the temperature of the lower electrode plate 154 in the range of about 50° C. to about 200° C.

The first and second temperature controllers 135 and 155 may be heaters, but the present disclosure is not limited thereto.

The rate of generation of $F_2$ through the recombination rate of F radicals ("F*") on the surfaces of a processing chamber 100 may vary depending on the temperature. For example, in a case where the surfaces of the processing chamber 100 are coated with Ni, the generation rate of $F_2$ may reach its maximum at a temperature of about 90° C. to about 110° C. The substrate processing apparatus can efficiently control etching selectivity by using the first and second temperature controllers 135 and 155.

Referring to FIG. 13, the substrate processing apparatus includes a gas supplier 210 and a remote plasma source (RPS) generator 220.

The gas supplier 210 may supply a first process gas G1 to the RPS generator 220. The first process gas G1 may be a source gas for generating plasma P. In some embodiments, the first process gas G1 may include an F-contained gas. For example, the first process gas G1 may include at least one of $NF_3$, $SiF_6$, $CF_4$, and HF, but the present disclosure is not limited thereto. In some embodiments, the first process gas G1 may further include an inert gas such as He.

The RPS generator 220 may provide an RPS, which is generated outside a processing chamber 100, to the processing chamber 100. For example, the RPS generator 220 may receive the first process gas G1 from the gas supplier 210, may transform the first process gas G1 into plasma, and may provide the generated plasma to the processing chamber 100.

A method of fabricating a semiconductor device according to some embodiments of the present disclosure will hereinafter be described with reference to FIGS. 1 through 22. FIGS. 15 through 22 illustrate a method of fabricating a multibridge channel field-effect transistor (MBCFET®) including a multibridge channel, but one of ordinary skill in the art will understand that the technical concept of the present disclosure is also applicable to various other semiconductor devices.

Figure 14:
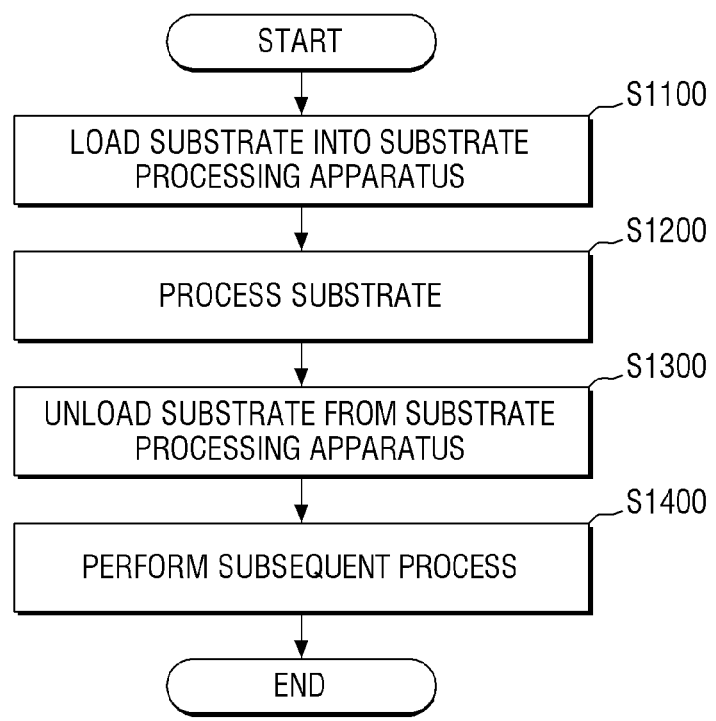
FIG. 14 is a flowchart illustrating a method of fabricating a semiconductor device according to some embodiments of the present disclosure.

FIG. 14 is a flowchart illustrating a method of fabricating a semiconductor device according to some embodiments of the present disclosure. For convenience, the embodiment of FIG. 14 will hereinafter be described, focusing mainly on the differences with the embodiments of FIGS. 1 through 13.

Referring to FIG. 14, the substrate W is loaded in a substrate processing apparatus (S1100).

The substrate W may include, for example, Si. Alternatively, the substrate W may include a semiconductor element such as germanium (Ge) or a compound semiconductor such as silicon carbide (SiC), gallium arsenide (GaAs), indium arsenide (InAs), or indium phosphide (InP). In some embodiments, the substrate W may include a conductive region such as, for example, a well doped with impurities. The substrate W may have a first surface, which is an active surface, and a second surface, which is opposite to the first surface and is an inactive surface. The substrate W may be disposed on a substrate support 120 such that the second surface may face the substrate support 120.

The substrate W may be a wafer that has already been subject to a series of processes. Examples of the processes may include: i) an oxidation process for forming an oxide film; ii) a lithography process including spin coating, exposure, and development steps; iii) a thin film deposition process; iv) a dry or wet etching process; and/or v) a metal wiring process.

The oxidation process is a process of forming a thin, uniform silicon oxide film by causing a chemical reaction between oxygen or water vapor and the surface of a Si substrate at a high temperature of 800° C. to 1200° C. The oxidation process may include a dry or wet oxidation process. The dry oxidation process may form an oxide film by causing a reaction with oxygen gas, and the wet oxidation process may form an oxide film by causing a reaction with oxygen and water vapor.

In some embodiments, a Silicon-on-Insulator (Sop structure may be formed on the substrate W by the oxidation process. The substrate W may include a buried oxide layer. In some embodiments, the substrate W may have various isolation structures such as a shallow trench isolation (STI) structure.

The lithography process is a process of transferring a circuit pattern formed in advance with a lithography mask onto the substrate W through exposure. The lithography process may be performed in the order of spin coating, exposure, and development steps.

The thin film deposition process may be one of, for example, atomic layer deposition (ALD), chemical vapor deposition (CVD), plasma-enhanced CVD (PECVD), metal organic CVD (MOCVD), physical vapor deposition (PVD), reactive pulsed laser deposition, molecular beam epitaxy, and direct current (DC) magnetron sputtering.

The dry etching process may be one of, for example, reactive ion etching (RIE), deep RIE (DRIE), ion beam etching (IBE), and argon (Ar) milling. Alternatively, the dry etching process may be atomic layer etching (ALE). The wet etching process may be an etching process using at least one of $Cl_2$, HCl, $CHF_3$, $CH_2F_2$, $CH_3F$, $H_2$, $BCl_3$, $SiCl_4$, $Br_2$, HBr, $NF_3$, $CF_4$, $C_2F_6$, $C_4F_8$, $SF_6$, $O_2$, $SO_2$, and COS as an etchant gas.

The metal wiring process may be a process of forming conductive wiring (or metal wiring) for realizing a circuit pattern for an operation of a semiconductor device to be formed. Paths for the transmission of ground, power, and signals for operating the semiconductor device may be formed by the metal wiring process. Here, the metal wiring may include gold (Au), platinum (Pt), silver (Ag), Al, and/or tungsten (W).

In some embodiments, a planarization process (e.g., chemical mechanical polishing (CMP)), an ion implantation process, and the like may also be performed during the fabrication of the semiconductor device.

The substrate W may be transferred by a transport device including a sophisticated clean room transport system. The transport device may include a conveyor system or the like. The transport device may load the substrate W into the substrate processing apparatus. In some embodiments, the transport device may load the substrate W into a load port adjacent to the substrate processing apparatus, and the substrate W may then be loaded from the load port into the substrate processing apparatus by a separate robot arm.

Thereafter, the substrate W is processed (S1200).

The processing of the substrate W may be performed by any one of the substrate processing methods described above with reference to FIGS. 1 through 13.

Thereafter, the substrate W is unloaded from the substrate processing apparatus (1300).

Thereafter, a subsequent process is performed (S1400).

For example, the substrate W may be placed into equipment for performing the subsequent process. The subsequent process may include an oxidation process, a lithography process, a thin film deposition process, a dry or wet etching process, and/or a metal wiring process that have already been described above, and may also include an electrical die sorting (EDS) process, a packaging process, and a package testing process.

The EDS process may refer to a process of applying an electrical signal to a semiconductor device formed on the substrate W and determining whether the semiconductor device is erroneous based on a signal output from the semiconductor device in response to the applied electrical signal.

The packaging process may include a wafer back grinding process, a wafer sawing process, a die attachment process, a wire bonding process, a molding process, a marking process, a solder ball mounting process, an individualization process, and the like.

The package testing process may include an assembly-out test, a DC test, a burn-in test, a monitoring burn-in test, a post-burn-in test, a final test, and the like.

FIGS. 15 through 22 illustrate intermediate steps of a method of fabricating a semiconductor device according to some embodiments of the present disclosure. For convenience, the embodiment of FIGS. 15 through 22 will hereinafter be described, focusing mainly on the differences with the embodiments of FIGS. 1 through 14.

Figure 15:
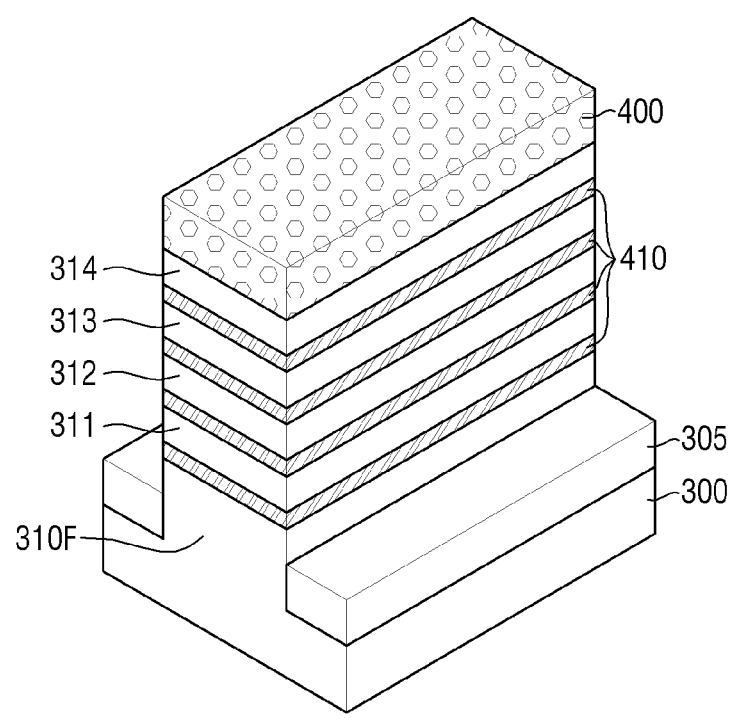
FIGS. 15 through 22 illustrate intermediate steps of a method of fabricating a semiconductor device according to some embodiments of the present disclosure.

Referring to FIG. 15, a plurality of sheet patterns, i.e., first through fourth sheet patterns 311 through 314, are formed on a substrate 300.

For example, first material films and second material films may be formed on the substrate 300 to be alternately stacked. Thereafter, a first mask pattern 400, which extends in a first direction, may be formed on the first material films and the second material films. Thereafter, a patterning process of patterning the first material films and the second material films by using the first mask pattern 400 as an etching mask may be performed. The patterned first material films may form a plurality of sacrificial patterns 410, and the patterned second material films may form a plurality of sheet patterns, i.e., the first through fourth sheet patterns 311 through 314, which are alternately stacked with the sacrificial patterns 410.

The first through fourth sheet patterns 311 through 314 and the sacrificial patterns 410 may have different etching selectivities with respect to a process etchant described above with reference to FIGS. 1 through 13. For example, the first through fourth sheet patterns 311 through 314 may include Si, and the sacrificial patterns 410 may include SiGe.

In some embodiments, during the patterning of the first material films and the second material films, part of the substrate 300 may be etched so that a fin pattern 310F may be formed. Thereafter, a field insulating film 305 may be formed on the substrate 300. The field insulating film 305 may cover at least parts of the side surfaces of the fin pattern 310F.

Figure 16:
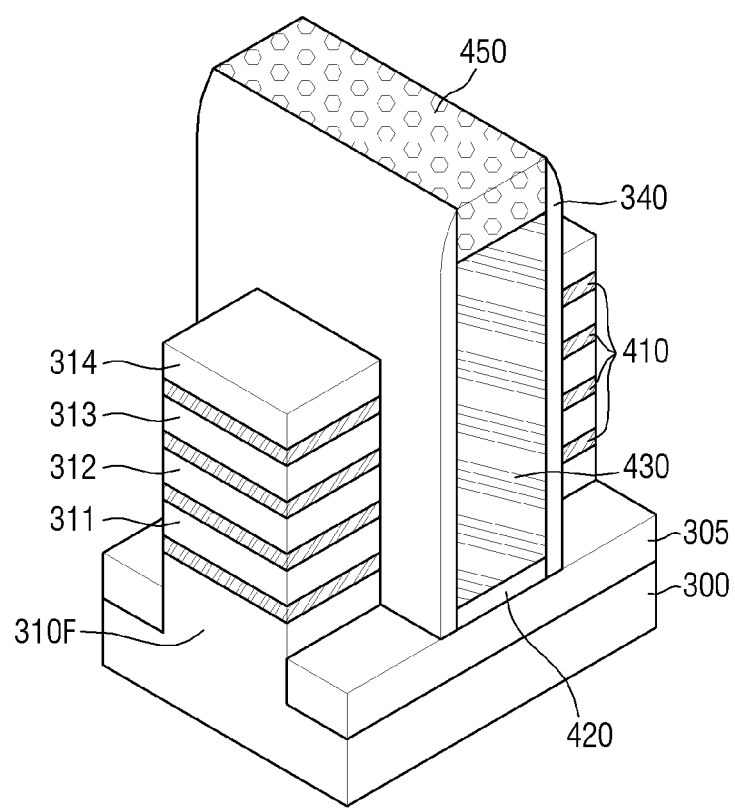

Referring to FIG. 16, a dummy gate structure (420 and 430) and gate spacers 340 are formed on the substrate 300.

The dummy gate structure (420 and 430) may be formed on the substrate 300 and the field insulating film 305. The dummy gate structure (420 and 430) may intersect the first through fourth sheet patterns 311 through 314 and the sacrificial patterns 410. For example, the dummy gate structure (420 and 430) may extend in a second direction, which is different from the first direction. The first through fourth sheet patterns 311 through 314 and the sacrificial patterns 410 may extend in the first direction to penetrate the dummy gate structure (420 and 430).

In some embodiments, the dummy gate structure (420 and 430) may include a dummy gate dielectric film 420 and a dummy gate electrode 430, which are sequentially stacked on the substrate 300 and the field insulating film 305. For example, a dielectric film and an electrode film may be formed on the substrate 300 and the field insulating film 305 to be sequentially stacked. Thereafter, a second mask pattern 450, which extends in the second direction, may be formed on the electrode film. Thereafter, a patterning process of patterning the dielectric film and the electrode film by using the second mask pattern 450 as an etching mask may be performed. The patterned dielectric film may form the dummy gate dielectric film 420, and the patterned electrode film may form the dummy gate electrode 430.

The dummy gate structure (420 and 430) may have a different etching selectivity from the first through fourth sheet patterns 311 through 314 and the sacrificial patterns 410. For example, the dummy gate electrode 430 may include poly Si.

The gate spacers 340 may be formed on the substrate 300 and the field insulating film 305. The gate spacers 340 may extend along the side surfaces of the dummy gate structure (420 and 430).

Figure 17:
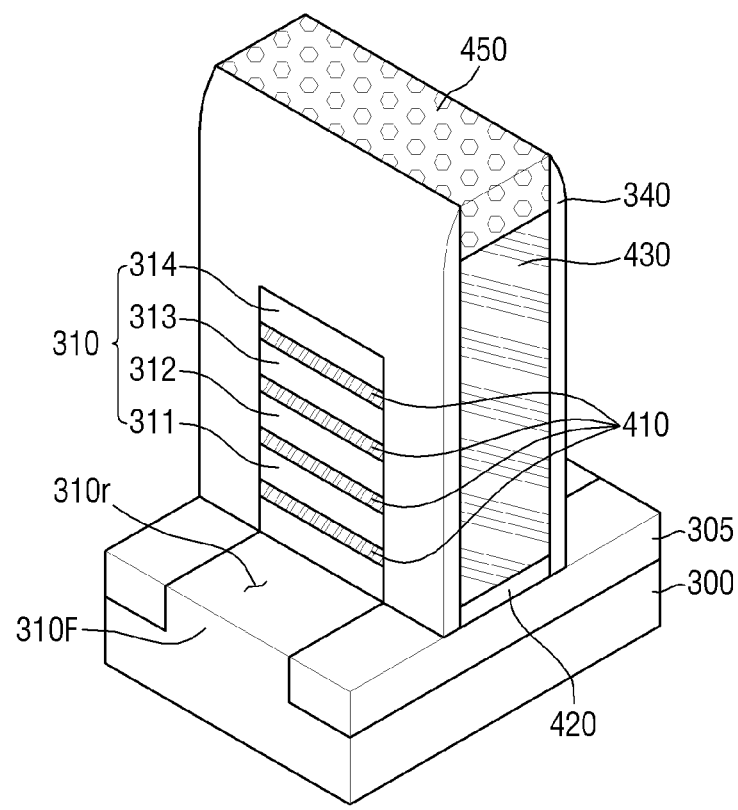

Referring to FIG. 17, a first recess process may be performed on the first through fourth sheet patterns 311 through 314 and the sacrificial patterns 410.

As the first recess process is performed, parts of the first through fourth sheet patterns 311 through 314 and parts of the sacrificial patterns 410 on the outside of the dummy gate structure (420 and 430) may be removed. As a result, a recess 310r may be formed, and active patterns 310, which include the first through fourth sheet patterns 311 through 314, may be formed. During the formation of the recess 310r, an upper part of the first fin pattern 310F may be removed.

Figure 18:
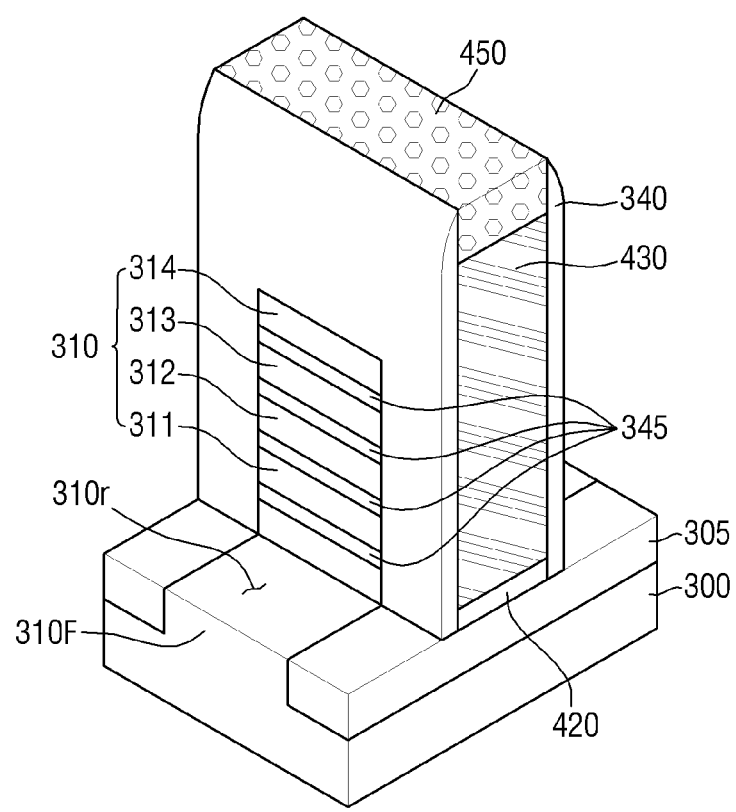

Referring to FIG. 18, inner spacers 345 may be formed on the side surfaces of the dummy gate electrode 430, between the active patterns 310.

For example, a second recess process may be performed on the sacrificial patterns 410 exposed by the recess 310r. As the second recess process is performed, the side surfaces of each of the sacrificial patterns 410 exposed by the recess 310r may be recessed. Thereafter, the inner spacers 345 may be formed to replace recessed parts of the sacrificial patterns 410.

In other embodiments, the inner spacers 345 may not be provided.

Figure 19:
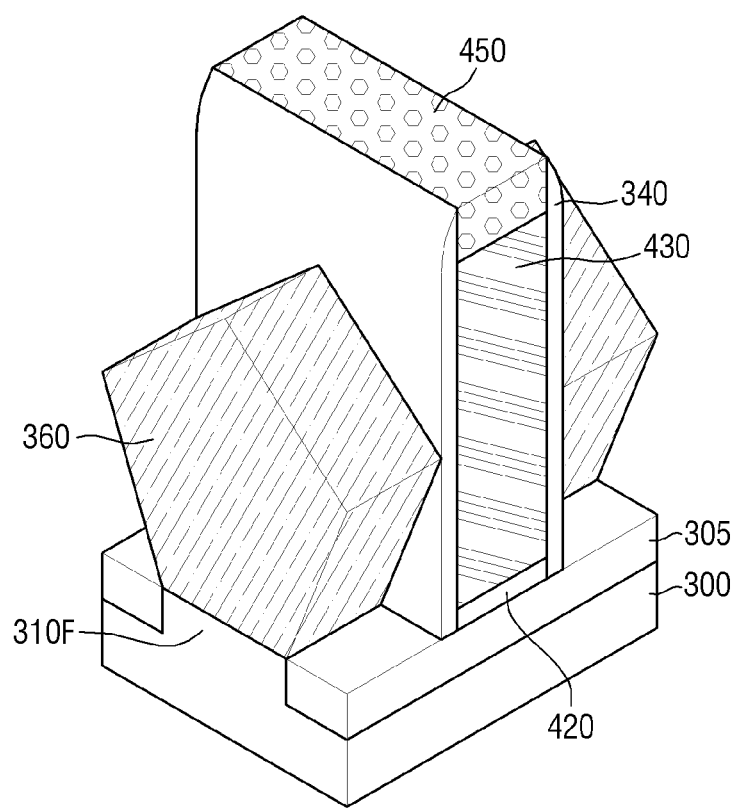

Referring to FIG. 19, source/drain regions 360 are formed on the side surfaces of the dummy gate structure (420 and 430).

The source/drain regions 360 may fill the recess 310r of FIG. 18. For example, the source/drain regions 360 may be formed by an epitaxial growth method using the fin pattern 310F and the active patterns 310 as seed layers. In this manner, the source/drain regions 360 connected to the active patterns 310 may be formed.

Figure 20:
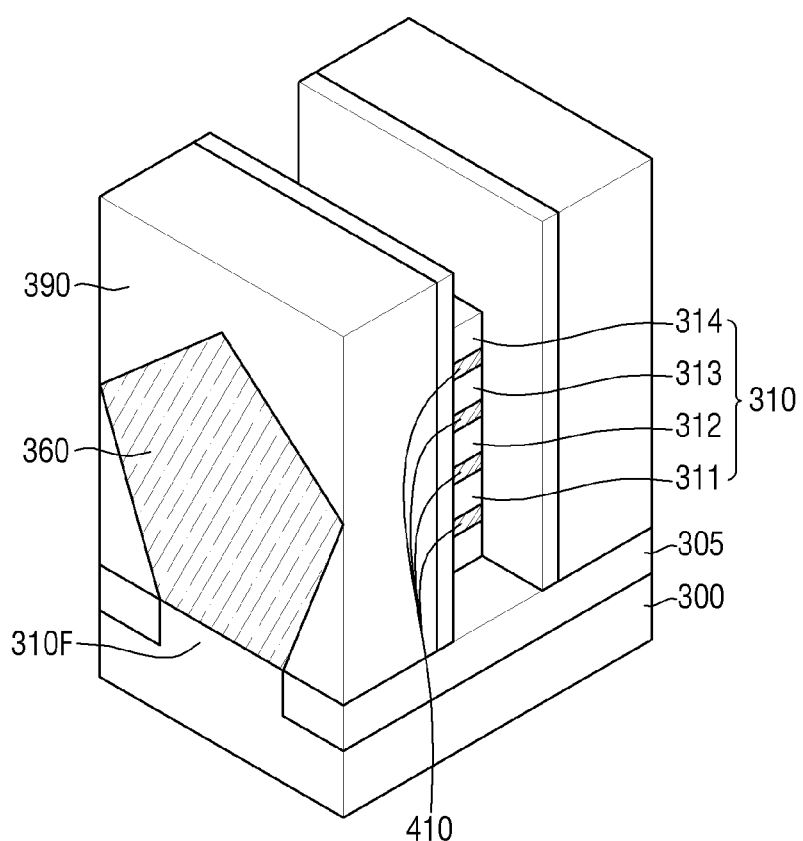

Referring to FIGS. 19 and 20, the dummy gate structure (420 and 430) is removed.

For example, an interlayer insulating film 390 may be formed on the substrate 300 and the field insulating film 305. The interlayer insulating film 390 may be formed to fill the space on the outer side surfaces of the gate spacers 340. Thereafter, a planarization process of exposing the dummy gate structure (420 and 430) may be performed. The planarization process may include, for example, a CMP process, but the present disclosure is not limited thereto. Thereafter, the dummy gate structure (420 and 430) exposed by the interlayer insulating film 390 and the gate spacers 340 may be removed.

As already mentioned above, as the dummy gate structure (420 and 430) has a different etching selectivity from the first through fourth sheet patterns 311 through 314 and the sacrificial patterns 410, the dummy gate structure (420 and 430) may be selectively removed. As the dummy gate structure (420 and 430) is removed, the active patterns 310 and the sacrificial patterns 410, which are disposed on the inside of the gate spacers 340, may be exposed.

Figure 21:
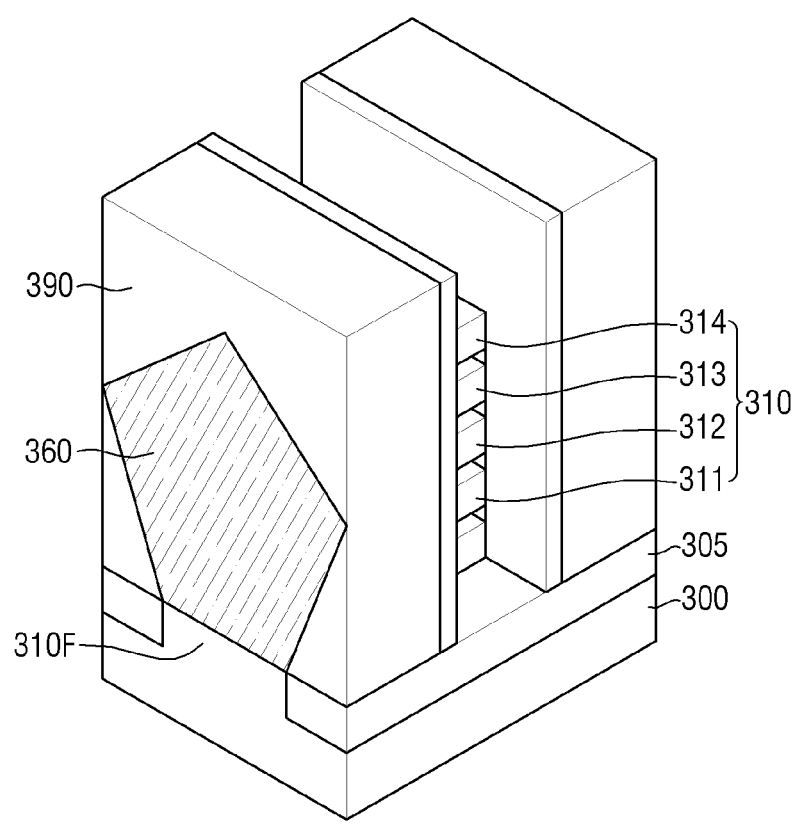

Referring to FIGS. 20 and 21, the sacrificial patterns 410 are removed.

The removal of the sacrificial patterns 410 may be performed by one of the substrate processing methods described above with reference to FIGS. 1 through 13. The sacrificial patterns 410 may be removed selectively with respect to the active patterns 310. As the sacrificial patterns 410 are removed, the active patterns 310, which are spaced apart from one another, may remain above the substrate 300.

Figure 22:
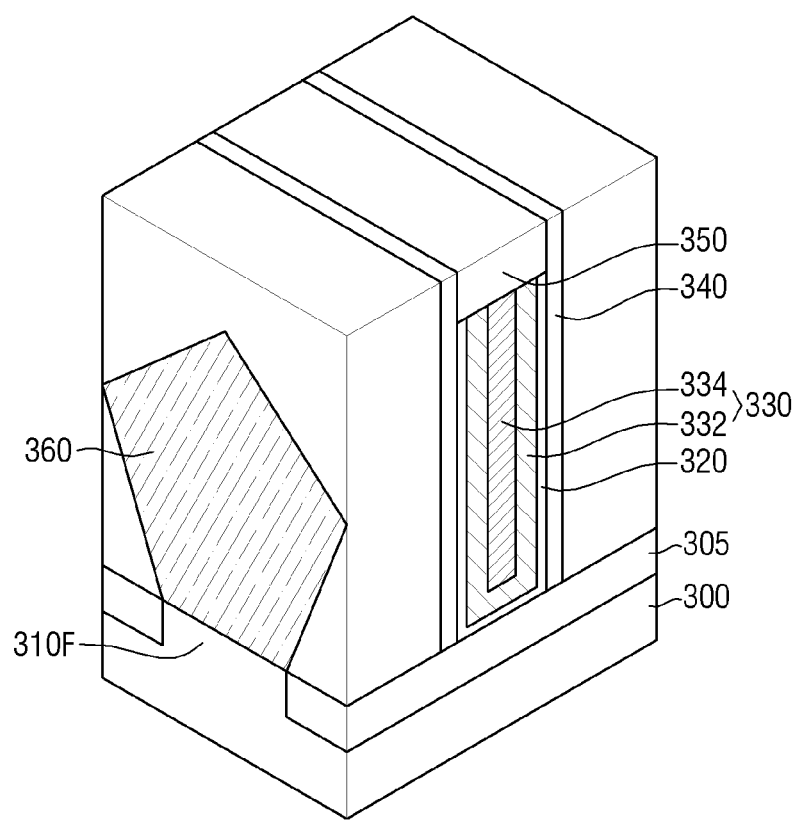

Referring to FIG. 22, a gate dielectric film 320 and a gate electrode 330 are formed.

The gate dielectric film 320 and the gate electrode 330 may be stacked on the active patterns 310. The gate electrode 330 may fill the gaps between the active patterns 310. In this manner, active patterns 310 penetrating the gate electrode 330 may be formed.

In some embodiments, the gate electrode 330 may include a work function control film 332 and a filling conductive film 334, which fills the space formed by the work function control film 332. The work function control film 332 and the filling conductive film 334 may be sequentially stacked on each of the active patterns 310. The work function control film 332 may include, for example, at least one of TiN, TaN, TiC, TaC, TiON, TiAlC, TiAlN, and a combination thereof, but the present disclosure is not limited thereto. The filling conductive film 334 may include, for example, W or Al, but the present disclosure is not limited thereto.

In some embodiments, a gate capping pattern 350 may be formed on the gate electrode 330. The gate capping pattern 350 may cover the top surface of the gate electrode 330. The top surfaces of the gate spacers 340 are illustrated as being disposed on the same plane as the top surface of the gate capping pattern 350, but the present disclosure is not limited thereto. Alternatively, the gate capping pattern 350 may be formed to cover the top surfaces of the gate spacers 340.

While the present disclosure has been particularly shown and described with reference to exemplary embodiments thereof, it will be understood by those of ordinary skill in the art that various changes in form and details may be made therein without departing from the spirit and scope of the present disclosure as defined by the following claims.

What is claimed is:

1. A method of fabricating a semiconductor device, comprising:
   loading a substrate in a substrate processing apparatus; and
   processing the substrate with the substrate processing apparatus,
   wherein the processing of the substrate comprises:
   providing a process gas;
   generating a preliminary etchant, which comprises a first etchant and a second etchant different from the first etchant, from the process gas through plasma ignition;
   generating a process etchant by controlling a composition ratio of the preliminary etchant so that a first etchant-to-second etchant ratio of the process etchant is different from a first etchant-to-second etchant ratio of the preliminary etchant; and
   processing the substrate with the process etchant.

2. The method of claim 1, wherein the process gas comprises a fluorine (F)-contained gas,
   wherein the first etchant comprises F radicals, and
   wherein the second etchant comprises $F_2$.

3. The method of claim 2, wherein the substrate comprises a first material film, which comprises silicon (Si), and a second material film, which comprises silicon germanium (SiGe), and
   wherein the processing of the substrate with the process etchant comprises performing a selective etching of the second material film with respect to the first material film.

4. The method of claim 3, wherein the first and second material films are alternately stacked.

5. The method of claim 1, wherein the controlling of the composition ratio of the preliminary etchant comprises:
   providing the preliminary etchant onto surfaces of a processing chamber; and
   controlling a ratio of the first etchant to the second etchant using surface conditions of the processing chamber.

6. The method of claim 5, wherein the processing chamber comprises a coating film which is coated on the surfaces of the processing chamber, and
   wherein the composition ratio of the preliminary etchant is controlled depending on the coating film.

7. The method of claim 1, wherein the controlling of the composition ratio of the preliminary etchant comprises:
   providing the preliminary etchant onto a dummy substrate, and;
   controlling a ratio of the first etchant to the second etchant considering reactivity to the dummy substrate.

8. A substrate processing method comprising:
   providing a process gas;
   generating a preliminary etchant, which comprises a first etchant and a second etchant different from the first etchant, from the process gas through plasma ignition;
   generating a process etchant by controlling a composition ratio of the preliminary etchant so that a first etchant-to-second etchant ratio of the process etchant is different from a first etchant-to-second etchant ratio of the preliminary etchant; and
   performing a selective etching of the substrate with the process etchant.

9. The substrate processing method of claim 8, wherein the process gas comprises a fluorine (F)-contained gas,
   wherein the first etchant comprises F radicals, and
   wherein the second etchant comprises $F_2$.

10. The substrate processing method of claim 9, wherein the selective etching of the substrate comprises selectively etching silicon germanium (SiGe) with respect to silicon (Si).

11. The substrate processing method of claim 9, wherein the controlling of the composition ratio of the preliminary etchant comprises:
    providing first F radicals onto surfaces of a processing chamber;
    loading the substrate in the processing chamber; and
    providing second F radicals onto the surfaces of the processing chamber.

12. The substrate processing method of claim 11, wherein the processing chamber comprises a coating film which is coated on the surfaces of the processing chamber, and
    wherein the coating film comprises at least one of $Y_2O_3$, YOF, $YF_3$, Ni, $Al_2O_3$, AlOF, AlN, Al, quartz ($SiO_2$), $ZrO_2$, and ceramic.

13. The substrate processing method of claim 8, wherein the controlling of the composition ratio of the preliminary etchant comprises:
    providing a dummy substrate in a processing chamber; and
    providing the preliminary etchant onto the dummy substrate.

14. The substrate processing method of claim 13, wherein the process gas comprises a F-contained gas,
    wherein the first etchant comprises F radicals,
    wherein the second etchant comprises $F_2$, and
    wherein the dummy substrate comprises one of a Si wafer, a $SiO_2$ wafer, and a SiGe wafer.

15. The substrate processing method of claim 13, further comprising loading the substrate in the processing chamber after the controlling of the composition ratio of the preliminary etchant.

16. A substrate processing method comprising:
    providing a fluorine (F)-contained gas;
    generating a preliminary etchant, which comprises first F radicals, from the F-contained gas through plasma ignition;
    providing a dummy substrate in a processing chamber;
    providing the preliminary etchant onto the dummy substrate;
    unloading the dummy substrate from the processing chamber;
    loading a substrate in the processing chamber;
    generating a process etchant with an F radicals-to-$F_2$ ratio by providing second F radicals in the processing chamber;

processing the substrate with the process etchant; and
unloading the substrate from the processing chamber.

17. The substrate processing method of claim 16, wherein the F-contained gas comprises at least one of $NF_3$, $SiF_6$, $CF_4$, and HF.

18. The substrate processing method of claim 16, wherein the processing chamber comprises a coating film which is coated on surfaces of the processing chamber, and
wherein the coating film comprises at least one of $Y_2O_3$, YOF, $YF_3$, Ni, $Al_2O_3$, AlOF, AlN, Al, quartz ($SiO_2$), $ZrO_2$, and ceramic.

19. The substrate processing method of claim 16, wherein the substrate comprises a first material film, which comprises silicon (Si), and a second material film, which comprises silicon germanium (SiGe), and
wherein the processing of the substrate with the process etchant comprises performing a selective etching of the second material film with respect to the first material film.

20. The substrate processing method of claim 19, wherein the dummy substrate comprises one of a Si wafer, a $SiO_2$ wafer, and a SiGe wafer.

* * * * *